United States Patent [19]

Graham

[11] 4,294,743
[45] Oct. 13, 1981

[54] EPOXY IMIDE

[75] Inventor: William F. Graham, Wilmington, Del.

[73] Assignee: E. I. Du Pont de Nemours and Company, Wilmington, Del.

[21] Appl. No.: 157,453

[22] Filed: Jun. 6, 1980

Related U.S. Application Data

[60] Division of Ser. No. 27,444, Apr. 5, 1979, which is a continuation-in-part of Ser. No. 848,638, Nov. 4, 1977, abandoned.

[51] Int. Cl.$^3$ ............................................. C08L 63/00
[52] U.S. Cl. ..................... 260/32.8 EP; 260/33.8 EP; 525/527; 525/530; 528/117
[58] Field of Search ................. 525/527, 530; 528/117, 528/830 TW; 260/830 TW, 830 P, 32.8 EP, 33.8 EP

[56] References Cited

U.S. PATENT DOCUMENTS

| | | | |
|---|---|---|---|
| 3,016,362 | 1/1962 | Wismer | 260/830 TW |
| 3,058,946 | 10/1962 | Nametz | 260/830 TW |
| 3,218,369 | 11/1965 | Hinkley | 260/830 TW |
| 3,452,116 | 6/1969 | Schwarzer | 260/830 TW P |
| 3,637,901 | 1/1972 | Bargain | 260/830 P |
| 3,730,948 | 5/1973 | Akiyama | 528/117 |
| 3,839,493 | 10/1974 | Balme | 260/830 P |
| 3,875,113 | 4/1975 | Lefebvre | 260/830 P |
| 3,883,486 | 6/1975 | Bargain | 260/830 P |
| 3,920,768 | 11/1975 | Kwiatkowski | |
| 3,978,152 | 8/1976 | Gruffaz | 260/830 P |
| 4,057,518 | 11/1977 | Angleraud | 260/830 P |
| 4,127,615 | 11/1978 | Zahir | 260/837 R |
| 4,128,598 | 12/1978 | Makino | 260/837 R |

FOREIGN PATENT DOCUMENTS

| | | | |
|---|---|---|---|
| 48-75234 | 11/1973 | Japan | 260/830 P |
| 50-78697 | 6/1975 | Japan | 260/830 P |
| 1175488 | 12/1969 | United Kingdom | |

*Primary Examiner*—Paul Lieberman
*Attorney, Agent, or Firm*—Hilmar L. Fricke

[57] ABSTRACT

A composition useful for making circuit boards which is the reaction product of
  (a) an epoxy resin or an epoxy novolac resin and optionally, a brominated epoxy resin and
  (b) a bismaleimide;

wherein the product of (a) and (b) is subsequently reacted with a curing agent such as a diamine of the formula $H_2N-R^1-NH_2$ where $R^1$ is an aromatic, aliphatic or cycloaliphatic group.

The composition is used to impregnate a fibrous substrate of fiberglass, high temperature polyamides or graphite fibers which is laminated to a copper sheet; the resulting laminate is used to form circuit boards that have good electrical and physical properties.

4 Claims, No Drawings

EPOXY IMIDE

CROSS REFERENCE TO RELATED APPLICATIONS

This application is a divisional application of Ser. No. 27,444 filed Apr. 5, 1979 which is a continuation-in-part of Ser. No. 848,638 filed Nov. 4, 1977, now abandoned.

BACKGROUND OF THE INVENTION

This invention is related to a composition that is useful for making circuit boards.

Circuit boards are widely used in the electrical industry for radio, television, appliances, industrial electrical equipment. In general, circuit boards are made by impregnating a woven fiberglass sheet with a resin and laminating copper sheet to one or both sides of the resin impregnated fiberglass sheet; then an electrical circuit is etched into the copper to form the circuit board. Electrical connections are usually soldered to the board when the board is utilized.

Polyimide resins have been used to impregnate these fiberglass sheets and form excellent quality circuit boards which have resistance to high temperatures, low thermal expansion and good electrical properties, such as a high level of resistivity. However, these boards are of a relatively high cost in comparison to circuit boards made from an epoxy resin impregnated fiberglass sheets. Circuit boards of epoxy resin impregnated fiberglass sheets are not resistant to high temperatures and have poorer electrical properties and a higher level of thermal expansion in comparison to circuit boards of polyimide resin impregnated fiberglass sheets.

There is a need for a composition that has a cost that is comparable to epoxy resins but that will form a circuit board having physical and electrical properties close to polyimide circuit boards but substantially better than epoxy resin circuit boards. The novel composition of this invention will form circuit boards that have such properties.

SUMMARY OF THE INVENTION

The composition comprises 20–80% by weight of a reaction product and 20–80% of a nonamide solvent for the reaction product having a dispersion solubility parameter of 7.2–10.5, a polar solubility parameter of 3–9.5 and a hydrogen bonding solubility parameter of 0–5.5; wherein the reaction product consists essentially of (a) an epoxy resin of the formula

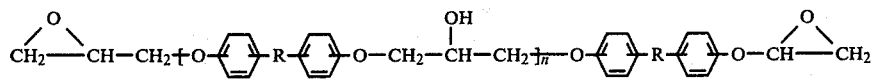

wherein R is an alkylene group of 1–4 carbon atoms, n is a positive integer and the resin has an epoxide equivalent of about 150–1000; or an epoxy novolac resin of the formula

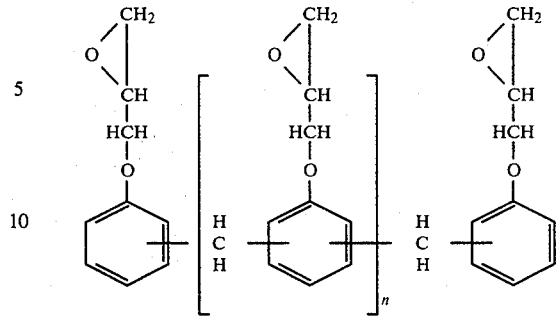

where n is a positive integer and the resin has an epoxide equivalent of about 150–300; and optionally, a brominated epoxy resin having the above epoxy resin formula except each aromatic group contains 2–4 bromine atoms that are substituted for hydrogen atoms of the aromatic group can be used with the above epoxy resin or epoxy novolac resin, (b) a bismaleimide of the formula

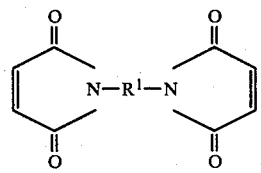

wherein (a) and (b) are reacted at 115°–135° C. for about 0.5–2 hours and subsequently contacting the product of (a) and (b) with (d) a curing agent such as a diamine of the formula $H_2N-R^1-NH_2$ to form the reaction product, where $R^1$ of the bismaleimide and diamine is an aromatic, aliphatic or cycloaliphatic group and wherein the molar ratio of bismaleimide to diamine is less than 1.

DESCRIPTION OF THE INVENTION

The composition contains about 20–80% by weight of the reaction product and 20–80% by weight of a nonamide solvent or a blend of nonamide solvents for the reaction product. For most uses of the composition, the composition contains about 50–70% by weight of the reaction product.

The combination of epoxy resin or epoxy novolac resin and the optional brominated epoxy resin comprises about 10–96% by weight of the reaction product.

The bismaleimide comprises about 2–60% by weight of the reaction product and the curing agent comprises about 2–30% by weight of the reaction product.

A process for forming the reaction product comprises the following steps:

(1) the epoxy resin or epoxy nonolac resin and the optional brominated epoxy resin are reacted with the bismaleimide at about 115°–135° C. for about 0.5–2 hours to form a product soluble in nonamide solvents, preferred reaction conditions are 115°–125° C. for about 0.75–1.25 hours.

(2) a curing agent, such as a diamine is added to the product of Step (1).

The reaction product may be diluted with an appropriate nonamide solvent. These nonamide solvents have dispersion solubility parameter of 7.2–10.5, a polar solubility parameter of 3–9.5 and a hydrogen bonding solubility parameter of 0–5.5. These solubility parameters are measured at 25° C. A discussion of solubility parameters is in *The Encyclopedia of Chemical Technology*, Supplement Vol., 2nd Edition (1971), pages 889–910, which is hereby incorporated by reference. Typically useful solvents are as follows

| Solvent | Dispersion Sol. Parameter | Polar Sol. Parameter | Hydrogen Bonding Sol. Parameter |
|---|---|---|---|
| Acetone | 7.6 | 5.1 | 3.4 |
| methylethyl ketone | 7.8 | 4.4 | 2.5 |
| cyclohexanone | 8.7 | 3.1 | 2.5 |
| diethyl ketone | 7.7 | 3.7 | 2.3 |
| methylisobutyl ketone | 7.5 | 3.0 | 2.0 |
| methylisoamyl ketone | 7.8 | 2.8 | 2.0 |
| methylene dichloride | 8.9 | 3.1 | 3.0 |
| nitrobenzene | 9.8 | 4.2 | 2.0 |
| acetonitrile | 7.5 | 8.8 | 3.0 |
| propionitrile | 7.5 | 7.0 | 2.7 |
| dichloroethane | 8.1 | 4.0 | 0.2 |
| ethylformate | 7.6 | 4.1 | 4.1 |
| 2,4-pentanedione | 7.8 | 3.9 | 2.8 |

Mixtures of the above solvents can be used and mixtures of the above solvents with other solvents that are not within the above solubility parameters can be used provided that the resulting mixture is within the above solubility parameters. Typically useful mixtures are cyclohexanol/methylethyl ketone, acetonitrile/methylisobutyl carbinol, diisobutyl ketone/propionitrile, cyclohexane/acetonitrile, propionitrile/toluene or xylene, acetonitrile/aliphatic hydrocarbon solvent and the like.

One preferred epoxy resin used to form the reaction product which forms a good quality circuit board has the formula

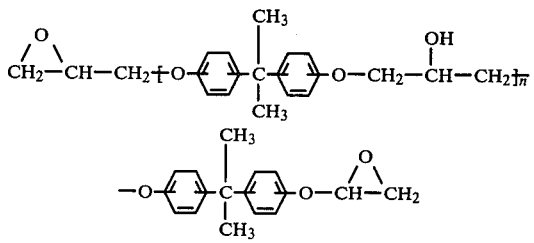

wherein n is a positive integer sufficient to provide a viscosity of 16,000–25,000 centipoises measured at 25° C. and has an epoxide equivalent of about 180–300.

Epoxide equivalent means the grams of resin that contain one-gram equivalent of epoxide.

One preferred epoxy novolac resin has the aforementioned formula for an epoxy novolac resin where n is a positive integer sufficiently large to provide a viscosity of about 1400–2000 centipoises measured at 25° C. and has an epoxide equivalent of about 170–180.

The brominated epoxy resin has the same formula as the above epoxy resin except each aromatic group contains 2–4 bromine atoms that are substituted for hydrogen atoms of the aromatic group. Preferably, the brominated epoxy resin has the formula

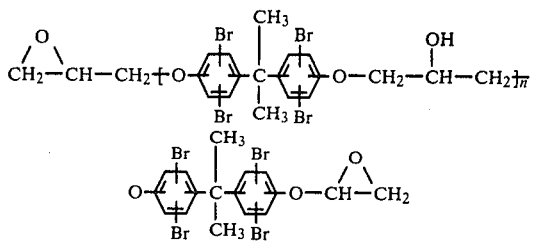

wherein n is a positive integer sufficient to provide a viscosity of about 250–4,000 centipoises measured at 25° C. and has an epoxide equivalent of about 300–800.

One particularly preferred brominated epoxy resin having the above formula has an epoxide equivalent of about 305–355 and contains about 44–48% by weight bromine.

Another preferred brominated epoxy resin having the above formula has an epoxide equivalent of about 460 and contains about 47–51% by weight bromine.

The bismaleimide used to form the reaction product is of the formula

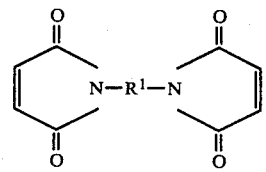

where $R^1$ is an aromatic, aliphatic, or a cycloaliphatic group.

Preferably a bismaleimide is used in which $R^1$ is an alkylene group having 1–6 carbon atoms, phenylene, cyclohexylene

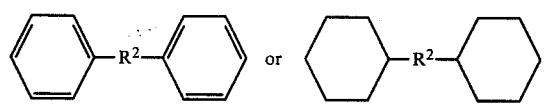

where $R^2$ is an alkylene group having 1–4 carbon atoms, $SO_2$ or O.

Examples of typical bismaleimides are as follows:
N,N'-ethylene-bis-maleimide
N,N'-butylene-bis-maleimide
N,N'-hexamethylene-bis-maleimide
N,N'-phenylene-bis-maleimide
N,N'-4,4'-diphenyl methane-bis-maleimide
N,N'-4,4'-diphenyl ether-bis-maleimide
N,N'-4,4'-diphenyl sulfone-bis-maleimide
N,N'-4,4'-dicyclohexyl methane-bis-maleimide
N,N'-xylylene-bis-maleimide
N,N'-diphenyl cyclohexane-bis-maleimide and the like.

The curing agent used to form the reaction product can be a diamine of the formula $H_2N-R^1-NH_2$ where $R^1$ is an aromatic, aliphatic or a cycloaliphatic group, an amide, a primary, secondary or tertiary monoamine, such as N,N'-dimethyl amino benzaldehyde or benzyl dimethyl amine, diethanol amine, triethanolamine, diethyl amino propylamine; polyamines, melamines. Lewis acids, such as boron trifluoride, boron trifluoride monethyl amine and the like.

Preferably, diamines are used as curing agents in which R¹ is an alkylene group that has 1-6 carbon atoms, phenylene, cyclohexylene,

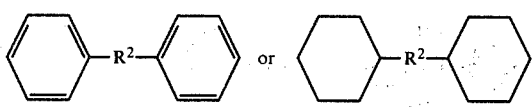

where R² is an alkylene group having 1-4 carbon atoms, SO₂ or O.

Examples of typically useful diamines are as follows:
ethylene diamine,
propylene diamine,
tetramethylene diamine,
pentamethylene diamine,
hexamethylene diamine,
2-ethylhexylene diamine,
nonamethylene diamine,
decamethylene diamine,
2,11-diamino-dodecane and the like;
meta-phenylene diamine,
para-phenylene diamine,
2,2'-naphthalene diamine,
4,4'-biphenylene diamine,
methylene dianiline-(4,4'-diaminodiphenyl methane),
ethylene dianiline-(4,4'-diaminodiphenyl ethane),
propylene dianiline-(4,4'-diaminodiphenyl propane), and the like;
oxydianiline-(4,4'-diaminodiphenylether), ketodianiline,
4,4'-diamino-diphenyl sulfide,
3,3'-diamino diphenyl sulfide,
4,4'-diamino diphenyl sulfone
3,3'-diamino-diphenyl sulfone,
bis-(para-amino-cyclohexyl)methane,
bis-(para-amino-cyclohexyl)ethane,
bis-(para-amino-cyclohexyl)propane,
bis-(para-amino-cyclohexyl)sulfide,
bis-(para-amino-cyclohexyl)sulfone,
bis-(para-amino-cyclohexyl)ether,
bis-(para-amino-cyclohexyl)diethyl silane,
bis-(para-amino-cyclohexyl)diphenyl silane,
bis-(para-amino-cyclohexyl)ethyl phosphine oxide,
bis-(para-amino-cyclohexyl)phenyl phosphine oxide,
bis-(para-amino-cyclohexyl)N-phenyl amine,
bis-(para-amino-cyclohexyl)N-methyl amine,
hexafluoroisopropylidene-bis-(4-phenyl amine),
4,4'-diamino-diphenyl methane,
4,4'-diamino-diphenyl ethane,
4,4'-diamino-diphenyl propane
4,4'-diamino-diphenyl butane,
2,6-diamino-pyridine,
bis-(4-amino-phenyl)diethyl silane,
bis-(4-amino-phenyl)diphenyl silane,
bis-(4-amino-phenyl)ethyl phosphine oxide,
bis-(4-amino-phenyl)phenyl phosphine oxide,
bis-(4-amino-phenyl)-N-phenylamine,
bis-(4-amino-phenyl)-N-methylamine,
3,3'-dimethyl-4,4'-diamino-biphenyl, 3,3'dimethoxybenzidine,
2,4-bis(b-amino-t-butyl)toluene,
bis-(para-b-amino-t-butyl-phenyl)ether,
para-bis(2-methyl-4-amino-phenyl)benzene,
para-bis-(1,1-dimethyl-5-amino-pentyl)benzene,
m-xylylene diamine,
p-xylylene diamine,
1,2-bis-(3-amino-propoxy)ethane
2,2-dimethyl propylene diamine,
3-methoxy-hexamethylene diamine,
2,5-dimethylheptamethylene diamine,
5-methylnonamethylene diamine,
1,4-diamino-cyclohexane, p1 1,2-diamino-octadecane,
2,5-diamino-1,3,4-oxadiazole, Preferred diamines are the above diamino diphenyl sulfones which form a high quality reaction product that has good electrical and physical properties.

The molar ratio of bismaleimide to diamine used in the reaction product is less than 1 and preferably is about 0.6-0.8. The most preferred ratio is 0.7 which forms a reaction product with good electrical and physical properties.

The following reaction products are preferred since these products are used for circuit boards that have good electrical and physical properties:

(1) a reaction product of about 30-60% by weight of the aforementioned epoxy resin, 10-30% by weight of the aforementioned brominated epoxy resin, 10-30% by weight of a bismaleimide and 10-30% by weight of a diamine;

(2) a reaction product of about 40% by weight of the aforementioned preferred epoxy resin, 20% by weight of the aforementioned preferred brominated epoxy resin, 20% by weight N,N'-4,4'-diphenyl methane bismaleimide and, 20% by weight of diamino diphenyl sulfone;

(3) a reaction product of about 15-35% by weight of the aforementioned brominated epoxy resin, 40-60% by weight of the aforementioned epoxy novolac resin, 15-35% by weight of a bismaleimide and 15-35% by weight of a diamine;

(4) a reaction product of about 20% by weight of the aforementioned preferred brominated epoxy resin; 40% by weight of the aforementioned preferred epoxy novolac resin, 20% by weight of N,N'-4,4'-diphenyl methane bismaleimide and 20% by weight of diamino diphenyl sulfone.

The reaction product is used in making bases for circuit boards. In preparing these bases, a fibrous substrate is coated and impregnated with the reaction product using conventional coating equipment and then the resulting impregnated substrate is cured at about 50° to 200° C. for about 1 to 30 minutes to form a rigid sheet. A sheet of copper or another conductive material is then laminated to the rigid sheet using the following laminating conditions: 50 to 1000 pounds per square inch, 50° to 300° C. for 30 to 300 minutes.

A circuit can then be etched into the conductive layer using conventional techniques to form a circuit board.

The reaction product can be used to coat and/or impregnate fibrous substrates, in particular high temperature resistant substrates, such as substrates of fiberglass, high temperature polyamides, graphite, and the like.

The following examples illustrate the invention. All parts and percentages are on a weight basis unless otherwise indicated.

EXAMPLE 1

The following constituents are charges into a reaction vessel equipped with a stirrer, a heating unit and a reflux condenser:

| | Parts by Weight |
|---|---|
| Portion 1 | |
| Epoxy resin (having the formula 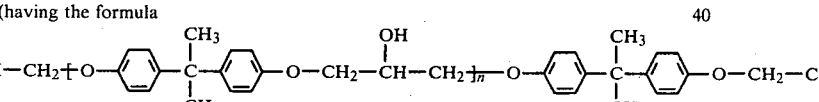 where n is a positive integer sufficiently large to provide a viscosity of 16,000–25,000 centipoises measured at 25° C. and has an epoxide equivalent* of about 192–203) | 40 |
| Brominated epoxy resin (having the above formula except the resin contains 44–48% by weight bromine and bromine atoms are substituted for hydrogen atoms of the aromatic groups and the resin has an epoxide equivalent* of 305–355) | 20 |
| Portion 2 | |
| Bismaleimide (having the formula  | 20 |
| Portion 3 | |
| Diamino diphenyl sulfone | 20 |
| Methyl ethyl ketone | 53 |
| Total | 153 |

*Epoxide Equivalent-grams of resin containing one-gram equivalent of epoxide.

Portion 1 is added to the vessel and heated to a temperature of 125° C. Portion 2 is then slowly added to the vessel while maintaining the temperature at 125° C. When Portion 2 is added, the temperature is increased to 130° C. and held at this temperature for 1 hour and cooled to 100° C. Portion 3 is premixed and then slowly added to the vessel while maintaining a temperature of 100° C. The resulting resin solution is cooled to 70° C. and held at this temperature for 30 minutes and then filtered.

About 0.5 parts by weight of boron fluoride monoethyl amine complex dissolved in methyl ethyl ketone per 100 parts by weight of resin solids are added to the above prepared resin solution. The resulting resin solution is then coated onto a fiberglass fabric using a conventional coating tower.

The following fiberglass fabrics are coated in the tower:
  108 glass fabric-1.5 ounces per square yard
  116 glass fabric-3.5 ounces per square yard
  7628 glass fabric-5.8 ounces per square yard.

The coating tower is operated at a speed of about 5–7 yards per minute and a heater temperature of a about 120°–135° C. is used. About 1.5 ounces of resin per square yard of fabric is applied to both sides of the fabric providing a resin impregnated and coated glass fabric.

A copper sheet is then laminated to the top and bottom of each of the resin impregnated and coated glass fabric by placing the copper sheets and the resin impregnated glass fabric in a press for about 60 minutes at 400 pounds per square inch and at a temperature of about 175° C. The resulting laminates are formed into circuit boards using conventional techniques.

The expansion of each of the circuit boards from 25° C. to 250° C. is measured. Each of the boards expanded only about 3.0% under these conditions.

EXAMPLE 2

The following constituents are charged into a reaction vessel equipped as in Example 1:

| | Parts by Weight Composition A |
|---|---|
| Portion 1 | |
| Epoxy novolac resin (having the formula 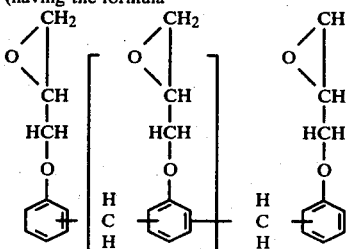 where n is a positive integer sufficiently large to provide a viscosity of 1400–2000 centipoises measured at 25° C. and the resin has an epoxide equivalent weight of 172–179) | 50 |
| Brominated Epoxy Resin (described in Example 1) | 25 |
| Portion 2 | |
| Bismaleimide (described in Example 1) | 25 |
| Portion 3 | |
| Diamino diphenyl sulfone | 25 |
| Methyl ethyl ketone | 165 |
| Total | 290 |

Portions 1, 2 and 3 are added and reacted using the identical conditions and procedures as used in Example 1 to form a resin solution. Boron fluoride mono methyl amine in the same amount as used in Example 1 is added to the resin solution.

The glass fabrics described in Example 1 are coated in a conventional coating tower with the above resin solution using the same coating speed and temperature conditions and the same amount of resin is applied to the fabric. A copper sheet is then laminated to the top and bottom of each of the resin impregnated and coated glass fabrics using the same time, temperature and pressure conditions used in Example 1. The resulting laminates are used for circuit boards.

The expansion of each of these circuit boards from 25° C. to 250° C. is measured. Each of the boards expanded about 3.0% under these conditions.

EXAMPLE 3

The following constituents are charges into a reaction vessel equipped with a stirrer, a heating unit and a reflux condenser:

The coating tower is operated at a speed of about 5–7 yards per minute and a heater temperature of about 120°–135° C. is used. About 1.5 ounces of resin per square yard of fabric is applied to both sides of the fabric providing a resin impregnated and coated glass fabric.

A copper sheet is then laminated to the top and bottom of each of the resin impregnated and coated glass fabric by placing the copper sheets and the resin impregnated glass fabric in a press for about 60 minutes at 400 pounds per square inch and at a temperature of about 175° C. The resulting laminates are formed into circuit boards using conventional techniques.

The expansion of each of the circuit boards from 25° C. to 250° C. is measured. Each of the boards expanded only about 3.0% under these conditions.

| | Parts by Weight |
|---|---|
| Portion 1 | |
| Epoxy resin (having the formula 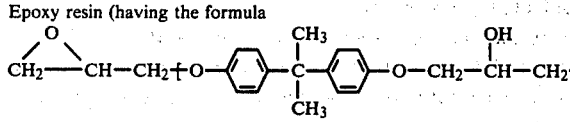 where n is a positive integer sufficiently large to provide a viscosity of 16,000–25,000 centipoises measured at 25° C. and has an epoxide equivalent* of about 192–203) | 40 |
| Brominated epoxy resin (having the above formula except the resin contains 47–51% by weight bromine and bromine atoms are substituted for hydrogenatoms of the aromatic groups and the resin has an epoxide equivalent* of 460 | 20 |
| Portion 2 | |
| Bismaleimide (having the formula 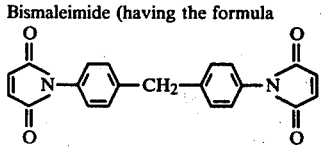 | 20 |
| Portion 3 | |
| Diamino diphenyl sulfone | 20 |
| Methyl ethyl ketone | 53 |
| Total | 153 |

*Epoxide Equivalent-grams of resin containing one-gram equivalent of epoxide

Portion 1 is added to the vessel and heated to a temperature of 115° C. Portion 2 is then slowly added to the vessel while maintaining the temperature at about 115–125° C. After Portion 2 is added, the temperature is held at 115°–125° C. for 1 hour and then the methylethyl ketone is added and the solution is cooled to 60°–70° C. The diaminodiphenyl sulfone is added and the temperature is held at about 60°–70° C. for about 1 hour and then the solution is cooled to the ambient temperature and then filtered.

About 0.5 parts by weight of boron fluoride monethyl amine complex dissolved in methylethyl ketone per 100 parts by weight of resin solids are added to the above prepared resin solution. The resulting resin solution is then coated onto a fiberglass fabric using a conventional coating tower.

The following fiberglass fabrics are coated in the tower:
108 glass fabric-1.5 ounces per square yard
116 glass fabric-3.5 ounces per square yard
7628 glass fabric-5.8 ounces per square yard.

EXAMPLE 4

Example 2 is duplicated using the identical constituents in the same amounts except the following procedure is used to make the resin solution:

Portion 1 is added to the vessel and heated to a temperature of 115° C. Portion 2 is then slowly added to the vessel while maintaining the temperature at about 115°–125° C. After Portion 2 is added, the temperature is held at 115°–125° C. for 1 hour and then the methylethyl ketone is added and the solution is cooled to 60°–70° C. The diaminodiphenyl sulfone is added and the temperature is held at about 60°–70° C. for about 1 hour and then the solution is cooled to the ambient temperature and then filtered. Boron fluoride mono methyl amine in the same amount as used in Example 1 is added to the resin solution.

The glass fabrics described in Example 1 are coated in a conventional coating tower with the above resin solution using the same coating speed and temperature conditions and the same amount of resin is applied to the fabric. A copper sheet is then laminated to the top and bottom of each of the resin impregnated and coated glass fabrics using the same time, temperature and pressure conditions used in Example 1. The resulting laminates are used for circuit boards.

The expansion of each of these circuit boards from 25° C. to 250° C. is measured. Each of the boards expanded about 3.0% under these conditions.

I claim:

1. A composition comprising 50–70% by weight of a reaction product and about 30–50% by weight of a solvent selected from the group consisting of acetone, methylene dichloride, cyclohexanone, pentanedione, methyl-N-amyl ketone, methylisobutyl ketone, methylethyl ketone; and mixtures thereof; wherein the reaction product consists essentially of about (1) 10–96% by weight, based on the weight of the reaction product, of a blend of the following

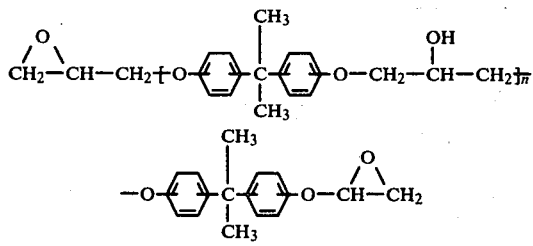

wherein n is a positive integer sufficient to provide a viscosity of 16,000–25,000 centipoises measured at 25° C. and having an epoxide equivalent of about 180–300 and (b) a brominated epoxy resin of the formula

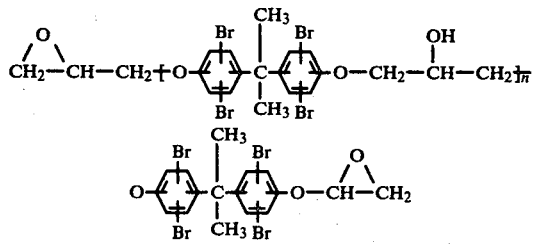

wherein n is a positive integer sufficiently large to provide a viscosity of 250–4,000 centipoises measured at 25° C., and the resin having an epoxide equivalent of about 300–800;

(2) 2–60% by weight, based on the weight of the reaction product, of a bismaleimide of the formula

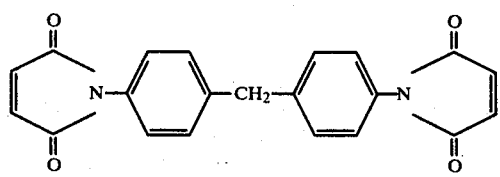

wherein (1) and (2) are reacted for about 0.5–2 hours at about 115°–135° C. and subsequently reacting the product of (1) and (2) with (3) 2–30% by weight, based on the weight of the reaction product, of a diamine of the formula

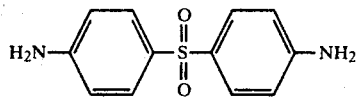

to form the reaction product;

wherein the molar ratio of bismaleimide to diamine is about 0.6–0.8.

2. A process for forming the reaction product of claim 1 which comprises the following steps:

(1) contacting the blend of epoxy resin and brominated epoxy resin with bismaleimide at about 115°–135° C. for about 0.5–2.0 hours to form a product and (2) adding the diamine to the product of Step 1.

3. A composition comprising 50–70% by weight of a reaction product and 30–50% by weight of a solvent selected from the group consisting of acetone, methylene dichloride, cyclohexanone, pentanedione, methyl-N-amyl ketone, methyl isobutyl ketone, methylethyl ketone mixtures thereof; wherein the reaction product consists essentially of about (1) 10–96% by weight, based on the weight of the reaction product, of a blend of the following (a) an epoxy novolac resin of the formula

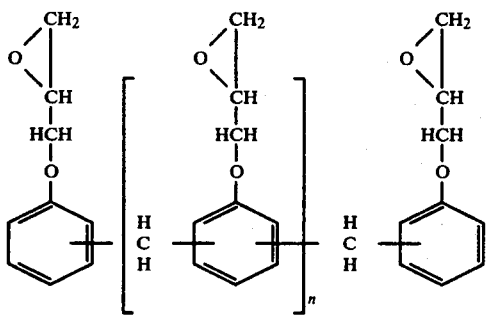

where n is a positive integer and the resin has an epoxide equivalent of about 170–180 and a viscosity of about 1400–2000 centipoises measured at 25° C. and (b) a brominated epoxy resin of the formula

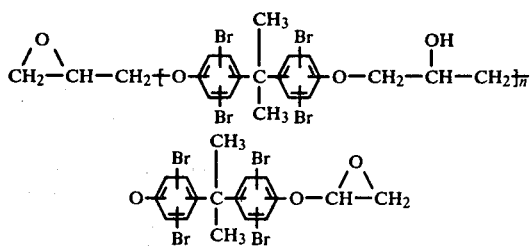

wherein n is a positive integer sufficiently large to provide a viscosity of 250–4,000 centipoises measured at 25° C., and the resin having an epoxide equivalent of about 300–800;

2–60% by weight, based on the weight of the reaction product, of a bismaleimide of the formula

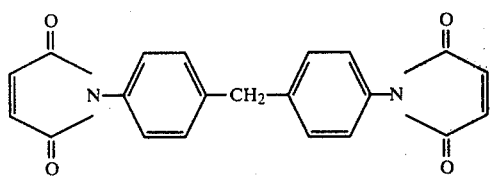

and wherein (1) and (2) are reacted at about 115°–135° C. for about 0.5–2.0 hours and subsequently reacting the product of (1) and (2) with (3) 2–30% by weight, based on the weight of the reaction product, of a diamine of the formula

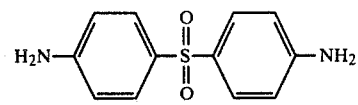

to form the reaction product;
wherein the molar ratio of bismaleimide to diamine is about 0.6–0.8.

4. A process for forming the reaction product of claim 3 which comprises the following steps
(1) contacting epoxy novolac resin and brominated epoxy resin with bismaleimide at about 115°–135° C. for about 0.5–2 hours to form a product and
(2) adding the daimine to the product of Step (1).